US007720326B2

(12) United States Patent
Wu et al.

(10) Patent No.: US 7,720,326 B2
(45) Date of Patent: May 18, 2010

(54) NANOWIRE-BASED PHOTODETECTORS

(75) Inventors: Wei Wu, Mountain View, CA (US); Scott Corzine, Sunnyvale, CA (US); Alexandre M. Bratkovski, Mountain View, CA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 311 days.

(21) Appl. No.: 11/699,291

(22) Filed: Jan. 29, 2007

(65) Prior Publication Data

US 2008/0310790 A1 Dec. 18, 2008

(51) Int. Cl.
*G02B 6/00* (2006.01)
*H01L 31/02* (2006.01)

(52) U.S. Cl. .................. 385/14; 385/12; 257/226; 257/461

(58) Field of Classification Search .................. 257/226, 257/461; 385/12, 14
See application file for complete search history.

(56) References Cited

U.S. PATENT DOCUMENTS

| 5,317,657 | A | * | 5/1994 | Gallo et al. | .............. 385/14 |
| 6,882,051 | B2 | * | 4/2005 | Majumdar et al. | .......... 257/746 |
| 7,260,279 | B2 | * | 8/2007 | Gunn et al. | .............. 385/2 |

* cited by examiner

*Primary Examiner*—Jerry T Rahll

(57) ABSTRACT

Various embodiments of the present invention are directed to nanowire-based photodetectors that can be used to convert information encoded in a channel of electromagnetic radiation into a photocurrent encoding the same information. In one embodiment of the present invention, a photodetector comprises a waveguide configured to transmit one or more channels of electromagnetic radiation. The photodetector includes a first terminal and a second terminal. The first terminal and the second terminal are positioned on opposite sides of the waveguide. The photodetector also includes a number of nanowires. Each nanowire interconnects the first terminal to the second terminal and a portion of each nanowire is embedded in the waveguide.

19 Claims, 8 Drawing Sheets

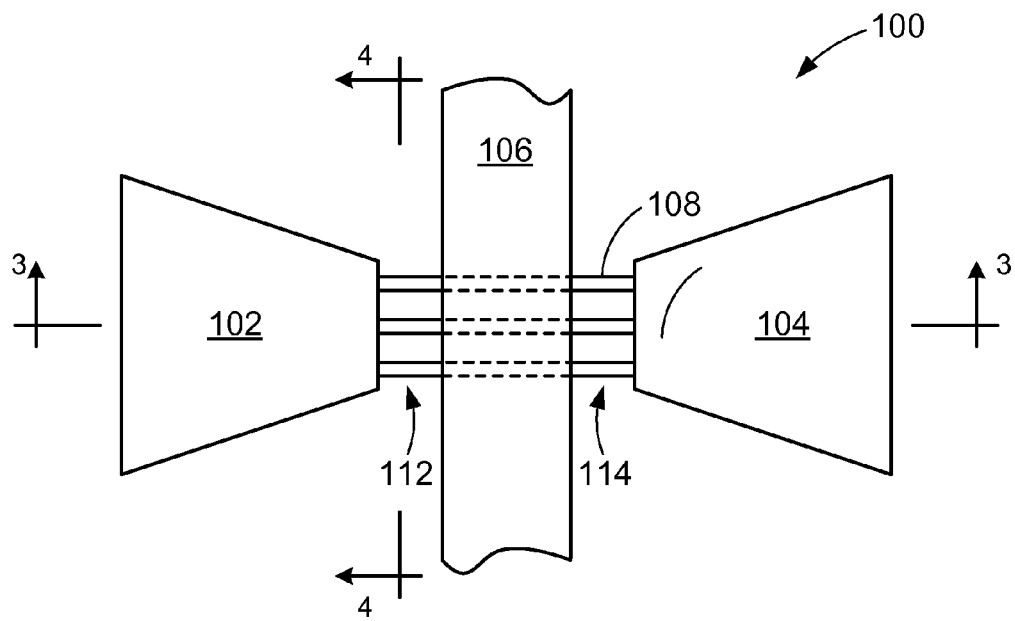
Figure 2
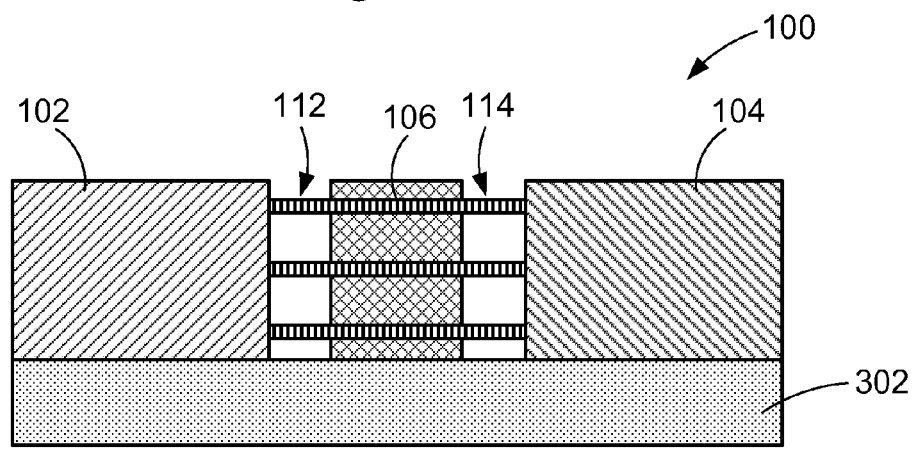
Figure 3
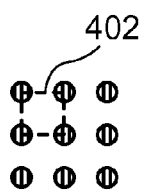
Figure 4
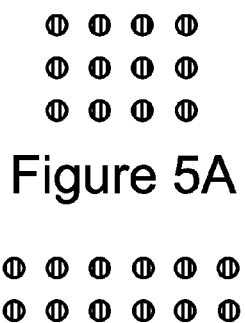
Figure 5A
Figure 5B
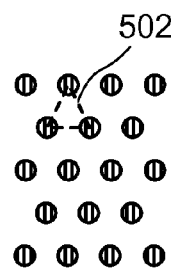
Figure 5C

US 7,720,326 B2

NANOWIRE-BASED PHOTODETECTORS

CROSS REFERENCE TO A RELATED APPLICATION

This application is related in part to a currently co-pending U.S. patent application entitled "Nanowire-based modulators," naming Shih-Yuan Wang, Scott Corzine, Wei Wu, and Alex Bratkovski as inventors, and filed concurrently with this application, which is identified as U.S. application Ser. No. 11/699,092.

TECHNICAL FIELD

Embodiments of the present invention are directed to photodetectors, and, in particular, to nanowire-based photodetectors that can be used to convert information encoded in electromagnetic radiation into a photocurrent encoding the same information.

BACKGROUND

Since the late 1970s, waveguides have increasingly supplanted conventional signal lines for transmitting information. Rather than encoding information in electrical signals and transmitting the encoded electrical signals via signal lines, the same information can be encoded in a channel of electromagnetic radiation and transmitted via waveguides, such as optical fibers, ridge waveguides, and photonic crystal waveguides. The term "channel," also called "optical channel," refers to electromagnetic radiation transmitted at one wavelength through a waveguide. Transmitting information encoded in channels via waveguides has a number of advantages over transmitting encoded electrical signals via signal lines. First, degradation or loss is much less for channels transmitted via waveguides than for electrical signals transmitted via signal lines. Second, waveguides can be fabricated to support a much higher bandwidth than signal lines. For example, a single Cu or Al wire can only transmit a single electrical signal, while a single optical fiber can be configured to transmit about 100 or more channels. Finally, electromagnetic radiation provides, in general, a much higher transmission rate.

Recently, advances in materials science and semiconductor fabrication techniques have made it possible to fabricate waveguides that can be, integrated with electronic devices, such as memory and processors, to form photonic integrated circuits ("PICs"), where the waveguides may be used to transmit information encoded in channels between the electronic devices. PICs are the photonic equivalent of electronic integrated circuits and may be implemented on a small wafer of semiconductor material that forms the base of the electronic devices. Unlike electronic integrated circuits where Si is the primary material, PICs may be composed of a variety of materials. For example, PICs may be composed of a single semconductor, such as Si on an insulator, or binary, ternary, and quaternary semiconductor compounds, such as InP and $Al_xGa_{1-x}As$, where x varies from 0 to 1.

In order to effectively implement PICs and waveguides for transmitting information encoded in channels between electronic devices, physicists, engineers, and computer scientists have recognized a need for devices that can be used to convert information encoded in channels into electrical signals encoding the same information for processing by the electronic devices.

SUMMARY

Various embodiments of the present invention are directed to nanowire-based photodetectors that can be used to convert information encoded in a channel of electromagnetic radiation into a photocurrent encoding the same information. In one embodiment of the present invention, a photodetector comprises a waveguide configured to transmit one or more channels of electromagnetic radiation. The photodetector includes a first terminal and a second terminal. The first terminal and the second terminal are positioned on opposite sides of the waveguide. The photodetector also includes a number of nanowires. Each nanowire interconnects the first terminal to the second terminal and a portion of each nanowire is embedded in the waveguide.

BRIEF DESCRIPTION OF THE DRAWINGS

FIG. 2 illustrates a top-view of the photodetector, shown in FIG. 1, that represents an embodiment of the present invention. FIG. 3 illustrates a first cross-sectional view of the photodetector, shown in FIG. 2, that represents an embodiment of the present invention.

FIG. 4 illustrates a second cross-sectional view of the photodetector, shown in FIG. 2, that represents an embodiment of the present invention.

FIG. 5A illustrates a cross-sectional view of twelve nanowires in a 3×4 configuration that represents an embodiment of the present invention.

FIG. 5B illustrates a cross-sectional view of twelve nanowires in a 2×6 configuration that represents an embodiment of the present invention.

FIG. 5C illustrates a cross-sectional view of 20 nanowires that represents an embodiment of the present invention.

DETAILED DESCRIPTION OF THE INVENTION

Figure 1:
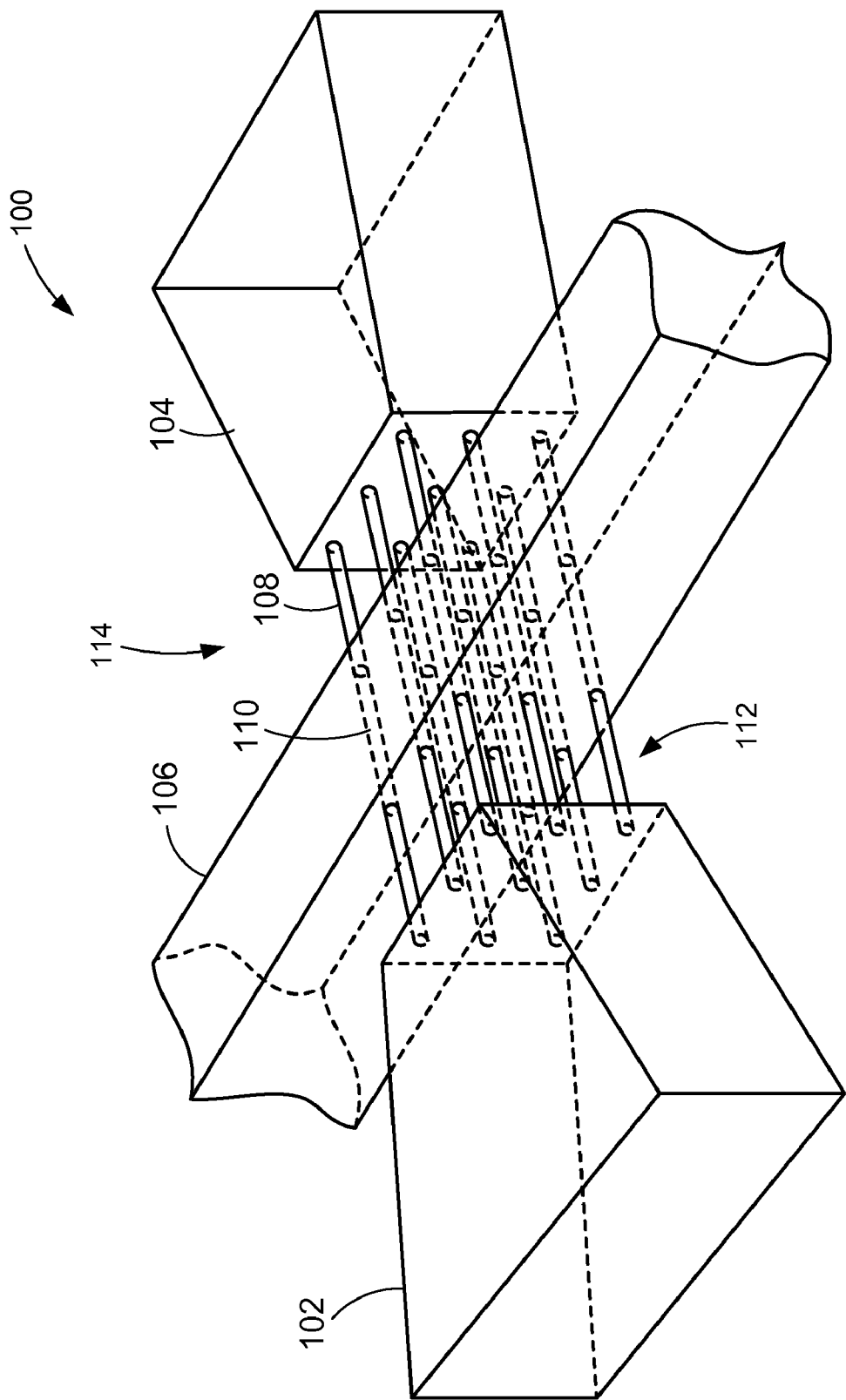
FIG. 1 illustrates an isometric view of a photodetector that represents an embodiment of the present invention.

Various embodiments of the present invention are directed to nanowire-based photodetectors that can be used to convert information encoded in a channel of electromagnetic radiation into a photocurrent encoding the same information. In the various photodetector embodiments described below, a number of structurally similar components have been provided with the same reference numerals and, in the interest of brevity, an explanation of their structure and function is not repeated.

FIG. 1 illustrates an isometric view of a modulator 100 that represents an embodiment of the present invention. The modulator 100 includes a first terminal 102, a second terminal 104, a waveguide 106, and nanowires, such as nanowire 108. Each nanowire interconnects the first terminal 102 to the second terminal 104 and a portion of each nanowire is embedded in the waveguide 106. For example, the nanowire 108 interconnects the first terminal 102 to the second terminal 104 and a portion 110 of the nanowire 108 is embedded in the waveguide 106. Gaps 112 and 114 prevent the first terminal 102 and the second terminal 104 from directly contacting the waveguide 106.

FIG. 2 illustrates a top-view of the modulator 100 that represents an embodiment of the present invention. As shown in FIG. 2, the gap 112 is formed between the first terminal 102 and the waveguide 106, and the gap 114 is formed between the second terminal 104 and the waveguide 106. Note that the first terminal 102 and the second terminal 104 are tapered toward the waveguide 106 in order to reduce the amount of interference between charge carriers flowing in the first terminal 102 and the second terminal 104 and the electromagnetic radiation transmitted in the waveguide 106. The cross-sectional dimensions of the nanowires interconnecting the first terminal 102 to the second terminal 104 are on the nanometer scale and the width of the waveguide 106 is on the micrometer scale. The width of the waveguide 106 needed depends on the wavelength of the channels transmitted in the waveguide 106.

FIG. 3 illustrates a cross-sectional view of the modulator 100, shown in FIG. 2, that represents an embodiment of the present invention. As shown in FIG. 3, the modulator 100 is supported by a substrate 302. The substrate 302 can be composed of an oxide, such as $SiO_2$, SiN, or any other suitable material having a refractive index smaller than the waveguide 106 and may also serve as a cladding layer.

Referring to FIGS. 1-3, the nanowires interconnecting the first terminal 102 to the second terminal 104 can be composed of a semiconductor material, including silicon, germanium, or binary, ternary, or quaternary II-VI or III-V semiconductor compounds. For example, the nanowires can be composed of either ZnTe or CdSe, both II-VI semiconductor compounds, or either GaAs or InP, both III-V semiconductor compounds. The nanowires can be grown between the first terminal 102 and the second terminal 104 using epitaxial growth techniques that are well-known in the art (see e.g., "Growth and characterization of indium phosphide single-crystal nanoneedles on microcrystalline silicon surfaces," *AppL Phys. A* (2006)). FIG. 4 illustrates a cross-sectional view of the nanowires interconnecting the first terminal 102 to the second terminal 104, shown in FIG. 2, that represents an embodiment of the present invention. As shown in FIG. 4, the nanowires are in a 3×3 configuration with a square unit cell 402. However, in other embodiments of the present invention, the nanowires can be arranged in any configuration to interconnect the first terminal 102 to the second terminal 104. For example, FIG. 5A illustrates a cross-sectional view of twelve nanowires in a 3×4 configuration with a square unit cell, and FIG. 5B illustrates a cross-sectional view of twelve nanowires in a 2×6 configuration with a square unit cell, each configuration representing an embodiment of the present invention. FIG. 5C illustrates a cross-sectional view of 20 nanowires with a triangular unit cell 502 configuration that represents an embodiment of the present invention.

Note that in other embodiments of the present invention, the number of nanowires, nanowire spacing, and configuration of nanowires may depend on a particular band of frequencies or wavelengths of the channels transmitted in the waveguide 106. Although FIGS. 4-5 show a relatively small number of nanowires interconnecting the first and second terminals 102 and 104, in other embodiments of the present invention, tens, hundreds, thousands, and even millions of nanowires may be used to interconnect the first and second terminals 102 and 104. In addition, although the nanowires in FIGS. 1-3 appear regularly spaced and substantially parallel, in other embodiments of the present invention, the nanowires can be oriented at different angles with respect to one another and can be randomly spaced between the first and second terminals 102 and 104. In other embodiments of the present invention, the nanowires can be doped with positive or negative dopants.

Referring to FIGS. 1-3, the first terminal 102 and the second terminal 104 can be composed of metal, silicide, or semiconductors, such as silicon, germanium, or binary, ternary, or quaternary II-VI or III-V semiconductor compounds, and can be fabricated using well-known chemical vapor deposition, photolithographic, or etching techniques. The type of material chosen for the first and second terminals 102 and 104 depends on the dimensions and configuration of the modulator 100 and on the band of frequencies or wavelengths of channels transmitted in the waveguide 106. The modulator 100 can be configured as a p-i-n photodiode by using doped semiconductors to form the first and second terminals 102 and 104, and an intrinsic semiconductor for the nanowires. For example, the first terminal 102 can be doped with a negative dopant, such as As, the second terminal 104 can be doped with a positive dopant, such as B. Intrinsic semiconductor nanowires serve as the depletion region between the first and second terminals 102 and 104.

Referring again to FIGS. 1-3, the waveguide 106 can be composed of any polymer material suitable for transmitting electromagnetic radiation and having a lower processing temperature than the nanowires and the first and second terminals 102 and 104. For example, the waveguide 106 can be composed of a methacrylate polymer, polycarbonate, cyclic olefin polymers, styrenic polymers, high refractive index polymers, fluorine-containing polymers, polyesters, polyethersulfone, and polyimides, just to name a few. The waveguide 106 can be fabricated using plasma enhanced chemical vapor deposition, or "spin-on" polymer techniques, which are just two of many well-known techniques that can be used to deposit polymer materials. The gaps 112 and 114 can be formed using photolithography or one of many dry etch techniques.

Figure 6:
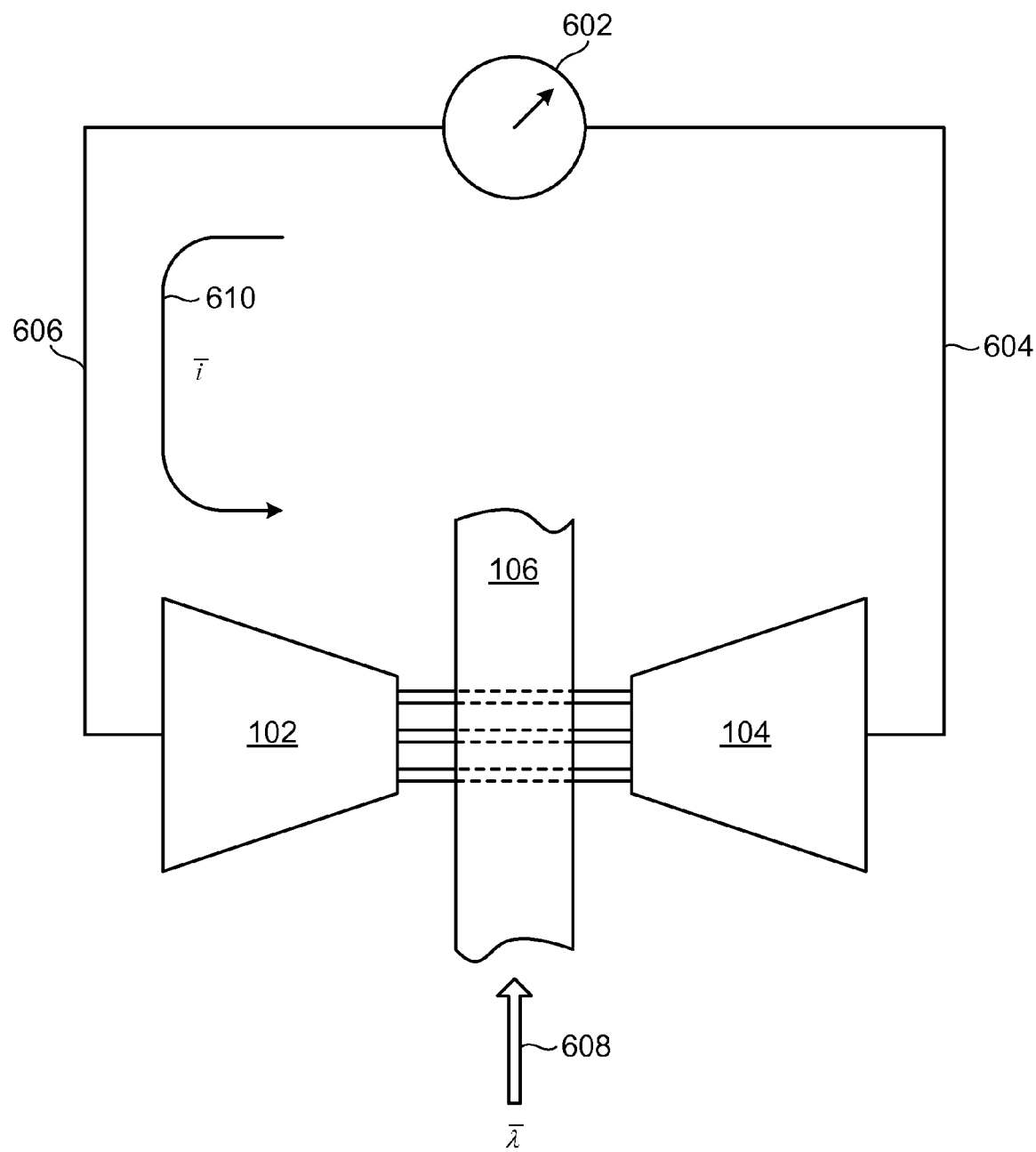
FIG. 6 illustrates a schematic of the photodetector connected to a meter that represents an embodiment of the present invention.

The photodetector 100 can be used to convert information encoded in a channel transmitted in the waveguide 106 into a photocurrent encoding the same information. FIG. 6 illustrates a schematic of the photodetector 100 connected to a current meter 602 that represents an embodiment of the present invention. As shown in FIG. 6, the photodetector 100 is connected to the meter 602 via wires 604 and 606. A channel encoding information, $\overline{\lambda}$, is transmitted in the waveguide 106. As the channel $\overline{\lambda}$ passes the nanowires embedded in the waveguide 106, the radiant energy of the channel $\overline{\lambda}$ generates a photocurrent encoding the same information, $\overline{i}$, that flows through the first and second terminals 102 and 104. The photocurrent $\overline{i}$ also flows through the wires 604 and 606, as represented by a directional arrow 608, and can be measured by the meter 602.

Information in computational systems is typically represented by sequences of bits. Each bit is equivalent to a choice between two alternatives, such as "yes" and "no," "true" and "false," or "on" and "off." The two states for a single bit are typically represented by the binary numbers "1" and "0." Although a channel is composed of a magnetic field component and an electric field component, for the sake of simplicity, the channel can be represented mathematically in the following discussion by the oscillating electric field component:

$$E(z,t) = E_0 \cos(zk - \omega t)$$

where z is the electric field propagation coordinate;
   ω is angular frequency that represents oscillation of the electric field;
   k is a wavevector equal to ω/c;
   t is time; and
   $E_0$ is the electric field amplitude.

Figure 7A:
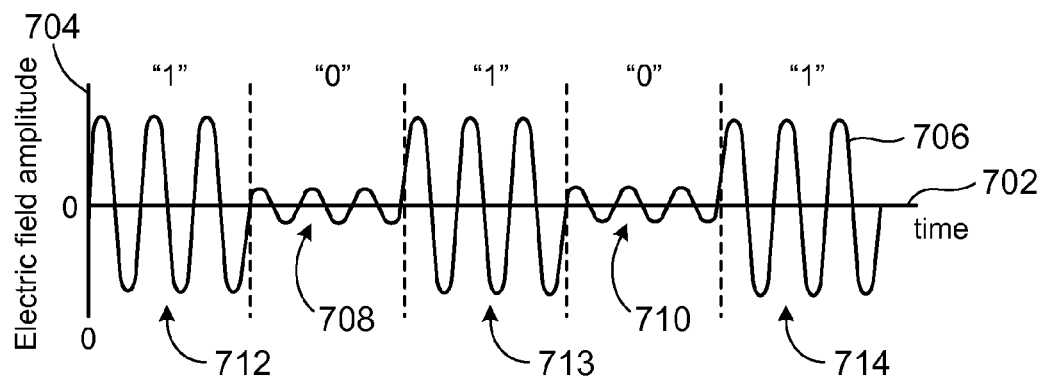
FIG. 7A shows a plot of an amplitude modulated electric field versus time.
Figure 7B:
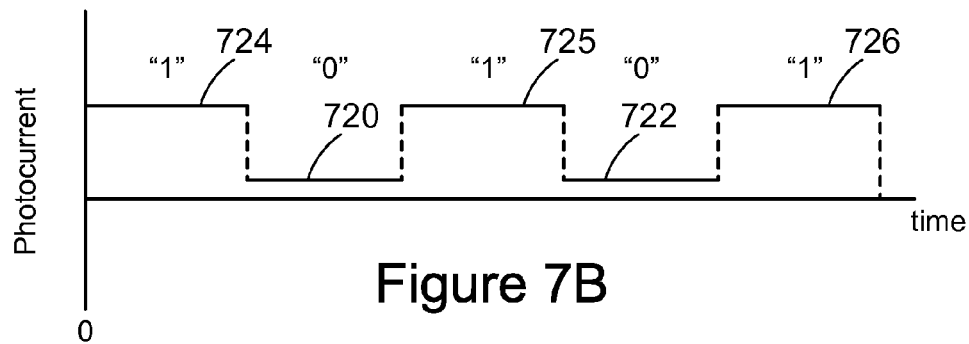
FIG. 7B shows a plot of a photocurrent versus time.

Information can be encoded in a channel by varying the strength or amplitude of the channel. The photodetector 100 can then be used to generate a photocurrent $\overline{i}$ with current levels that vary according to variations in the amplitude of the channel $\overline{\lambda}$. FIGS. 7A-7B provide a conceptual representation of converting information encoded in the amplitude of a channel $\overline{\lambda}$ into a photocurrent $\overline{i}$ encoding the same information using the photodetector 100. FIG. 7A shows a plot of the electric field component of information encoded in the amplitude of an oscillating electric field versus time. In FIG. 7A, a horizontal line 702 represents a time axis, and a vertical line 704 represents the electric field amplitude E. A curve 706 represents the electric field component of a channel that encodes a binary sequence "10101." In FIG. 7A, a single bit corresponds to four consecutive cycles of the electric field. The cycles 708 and 710 with relatively small amplitudes, correspond to the binary number "0," and the cycles 712-714 with relatively large amplitudes, correspond to the binary number "1." As the channel $\overline{\lambda}$ passes the nanowires embedded in the waveguide 106, shown in FIG. 6, the variation in the amplitude or strength of the channel generates a photocurrent $\overline{i}$ that flows through the first and second terminals 102 and 104 with a corresponding variation in signal level. In other words, the level or amount of photocurrent $\overline{i}$ varies with the amplitude or strength of the channel $\overline{\lambda}$. FIG. 7B shows a plot of the corresponding photocurrent $\overline{i}$ versus time. As shown in FIG. 7B, time-average current levels correspond to the variations in the amplitude of the electric field component 706, shown in FIG. 7A. For example, relatively small time-average current levels 720 and 722 correspond to the small amplitude cycles 708 and 710, and relatively large time-average current levels 724-726 correspond to relatively large amplitudes 712-714. The relatively small time-average current levels 720 and 722 represent the binary number "0," and the relatively large time-average current levels 724-726 represent the binary number "1."

In other embodiments of the present invention, the photodetector 100 can be connected to a node to form a photonic integrated circuit ("PIC"). The node can be memory, a single processor, a sensor, a field programmable gate array, an application specific integrated circuit, or other electronic device.

Figure 8:
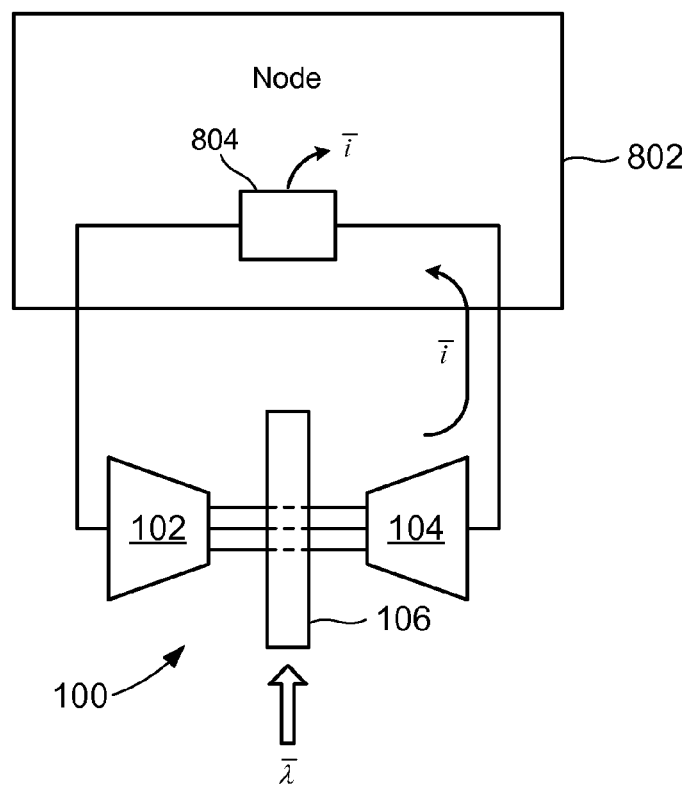
FIG. 8 illustrates a schematic representation of a first photonic integrated circuit that represents an embodiment of the present invention.

FIG. 8 illustrates a schematic representation of a first PIC 800 that represents an embodiment of the present invention. The PIC 800 includes a node 802 and the photodetector 100. The photodetector 100 converts information encoded in the channel $\overline{\lambda}$ into a photocurrent $\overline{i}$ encoding the same information, as described above with reference to FIGS. 6-8. The node 802 includes a contact 804 that serves as a junction so the photocurrent $\overline{i}$ can be transmitted from the photodetector 100 to the node 802 for further processing.

Figure 9A:
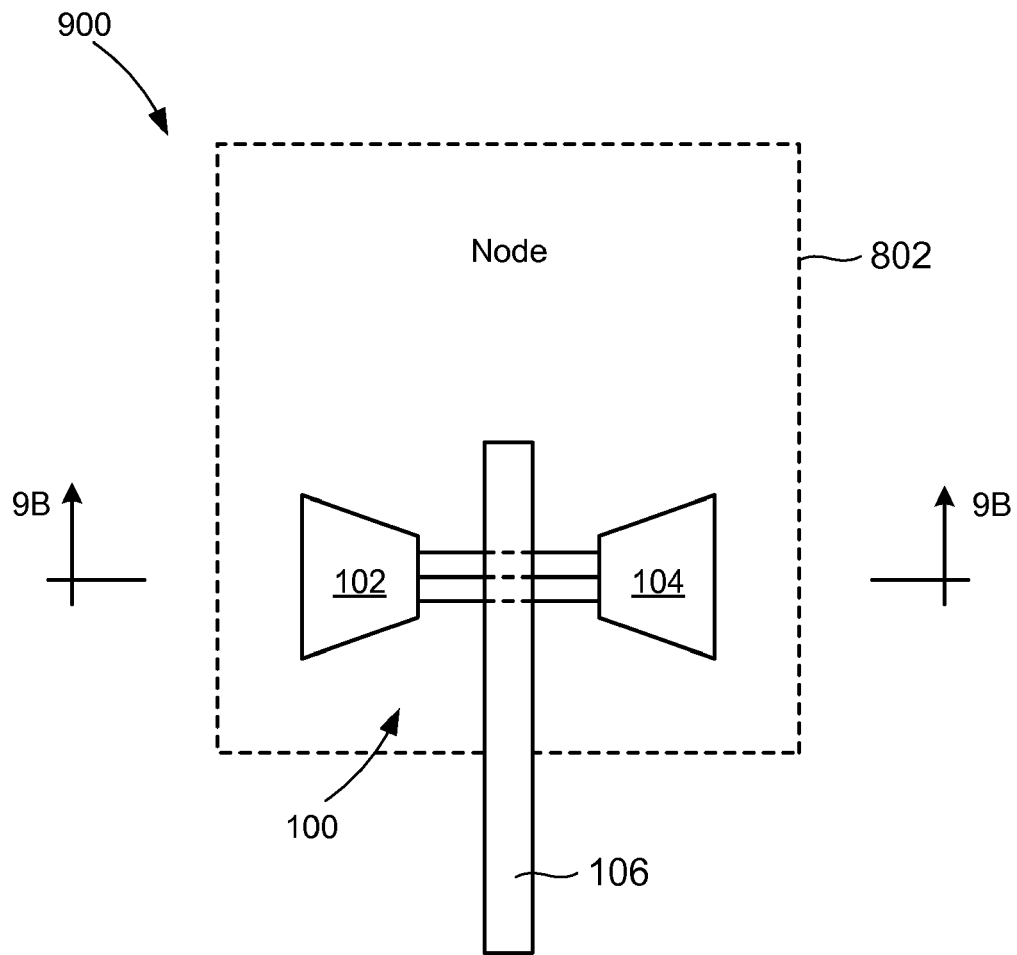
FIG. 9A illustrates a schematic representation of a second photonic integrated circuit that represents an embodiment of the present invention.
Figure 9B:
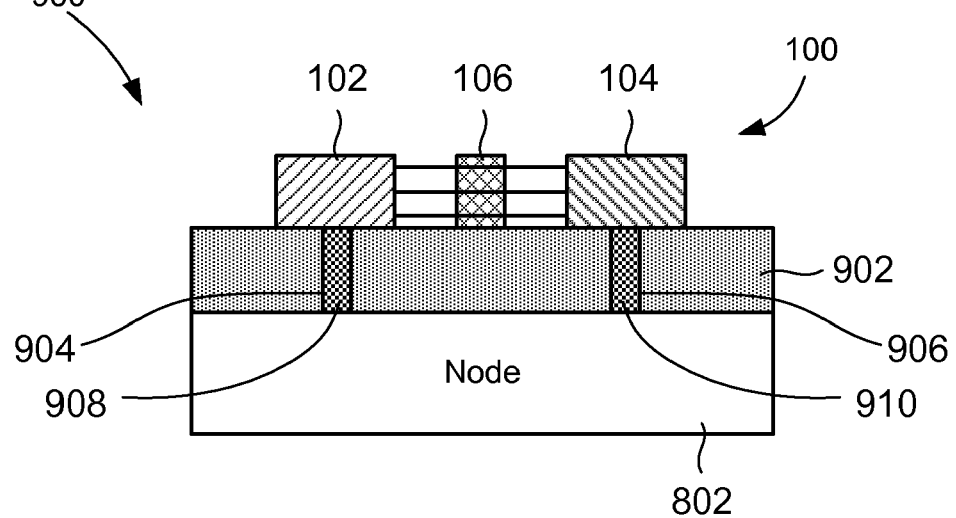
FIG. 9B illustrates a cross-sectional view of the photonic integrated circuit, shown in FIG. 9A, that represents an embodiment of the present invention.

FIG. 9A shows a second PIC 900 that represents an embodiment of the present invention. As shown in FIG. 9A, the PIC 900 includes the node 802, identified by dashed lines, which is located beneath the photodetector 100 that represents an embodiment of the present invention. The node 802 and the photodetector 100 can be separated by a substrate. The first terminal 102 and the second terminals 104 are connected to the node 802 through interconnects (not shown). FIG. 9B shows a cross-sectional view of the PIC 900, shown in FIG. 9A, that represents an embodiment of the present invention. As shown in FIG. 9B, the first terminal 102, the second terminal 104, and the waveguide 106 are supported by a substrate 902 that separates the photodetector 100 from the node 802. The substrate 902 can be composed of $SiO_2$, SiN, or any other material suitable for insulating the first terminal 102 and the second terminal 104 from the electronic devices comprising the node 802. The substrate 902 may also serve as a cladding layer for the waveguide 106. The substrate 902 includes vias 904 and 906 that span the height of the substrate 902 and are located beneath the first terminal 102 and the second terminal 104, respectively. Conductors 908 and 910 fill the vias 904 and 906, respectively, and operate as through substrate interconnects so that the photocurrent $\overline{i}$ generated by information-encoded in channels transmitted in the waveguide 106 can be transmitted to the node 802 for further processing.

Figure 10:
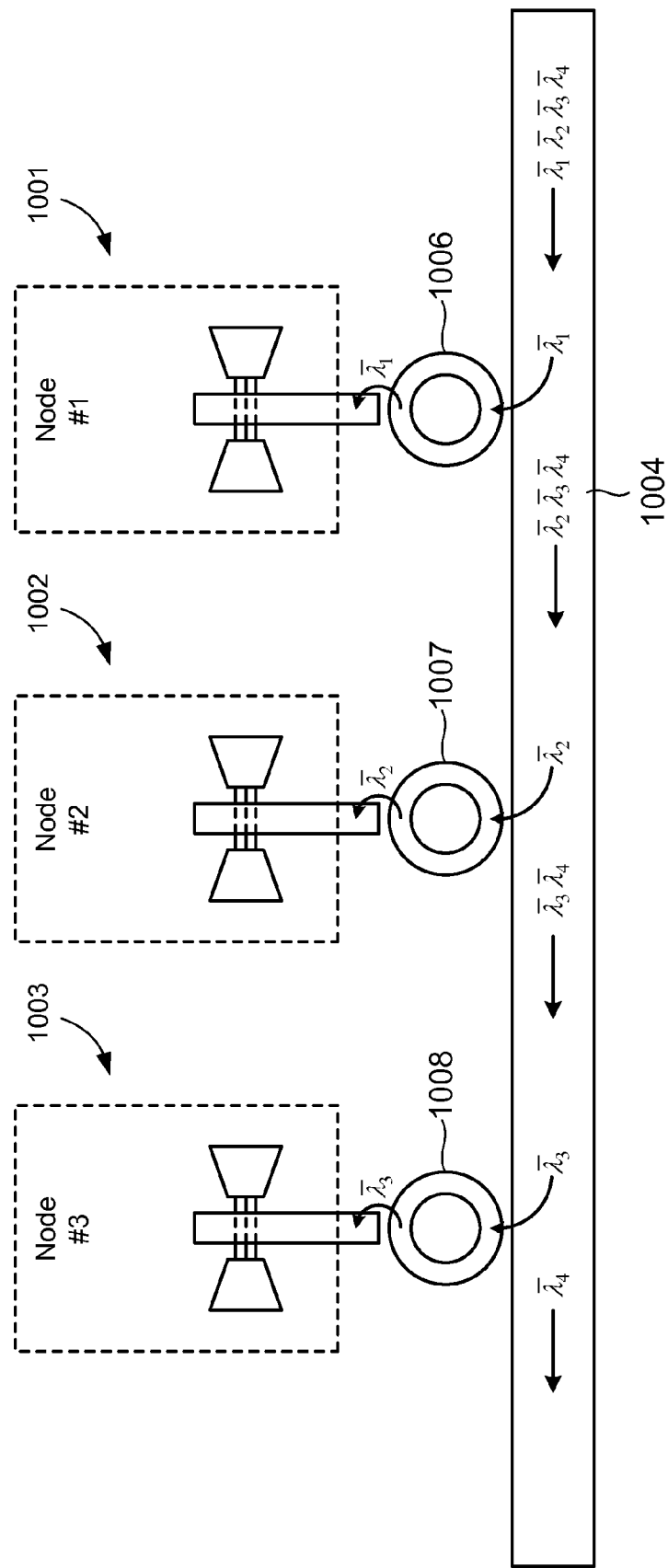
FIG. 10 illustrates three photonic integrated circuits optically coupled to a bus waveguide using microrings that represent an embodiment of the present invention.

A number of PICs described above with reference to FIG. 9 can be optically coupled to a bus waveguide to form larger integrated PICs. FIG. 10 shows three PICs 1001-1003 optically coupled to a bus waveguide 1004 that represent an embodiment of the present invention. As shown in FIG. 10, the PICs 1001-1003 are optically coupled to the bus waveguide 1004 via microrings 1006-1008, respectively. The microrings 1006-1008 can be configured with different dimensions and patterned with holes of various arrangements so that each microring can maintain a resonance with one of many channels simultaneously transmitted in the bus waveguide 1004. As a result, each of the microrings 1006-1008 serves as a drop filter by extracting via evanescent coupling a particular channel from the numerous channels transmitted in the bus waveguide 1004. For example, four different information encoded channels $\overline{\lambda}_1, \overline{\lambda}_2, \overline{\lambda}_3,$ and $\overline{\lambda}_4$ are transmitted simultaneously in the waveguide 1004. The first microring 1006 is configured to extract the channel $\overline{\lambda}_1$, the second microring 1007 is configured to extract the channel $\overline{\lambda}_2$, and the third microring 1008 is configured to extract the channel $\overline{\lambda}_3$. The channels $\overline{\lambda}_1, \overline{\lambda}_2,$ and $\overline{\lambda}_3$ can then be transmitted via evanescent coupling to waveguides of the PICs 1001-1003, respectively, for further processing.

Figure 11:
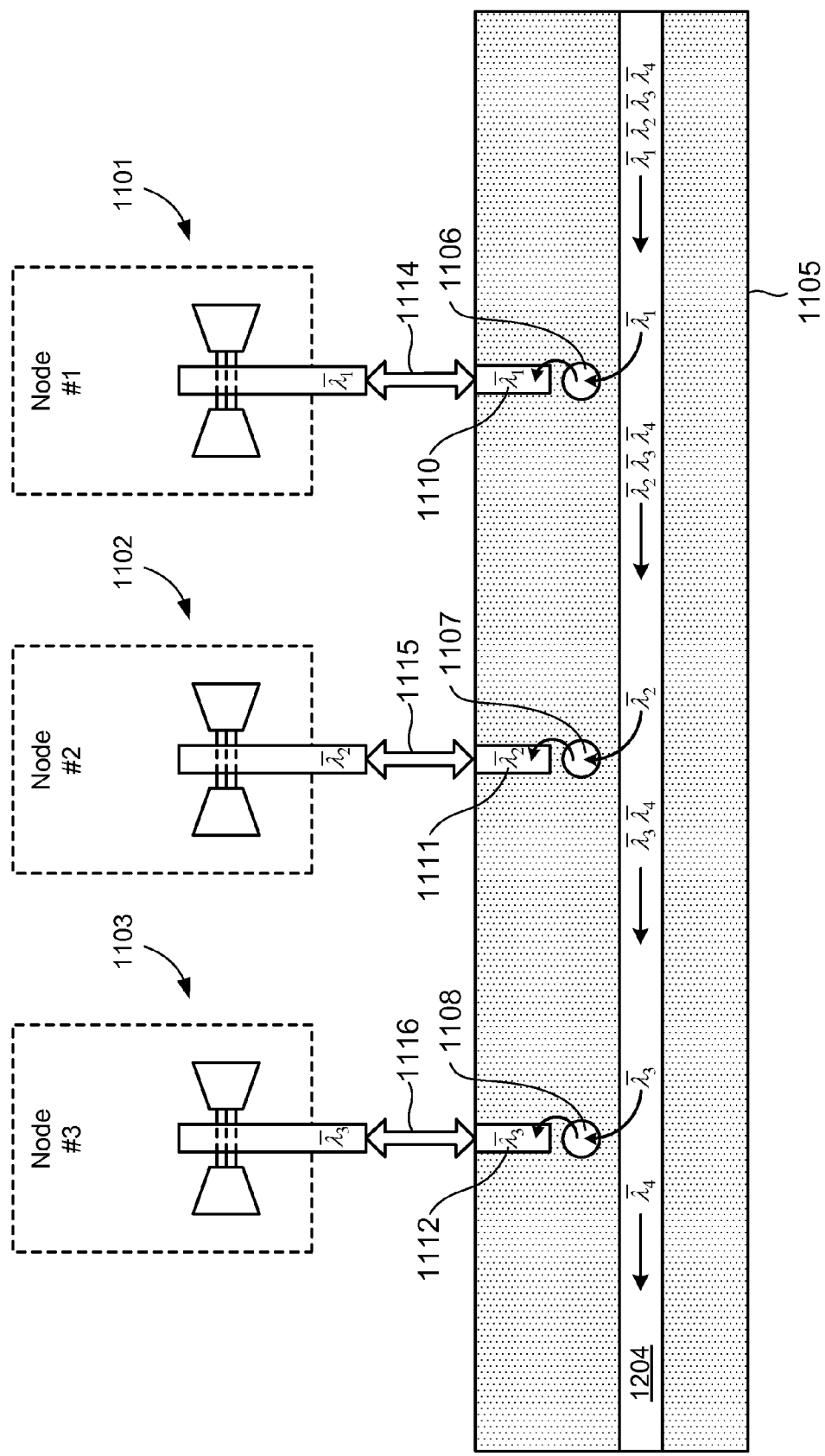
FIG. 11 illustrates three photonic integrated circuits optically coupled to a bus waveguide of a photonic crystal that represent an embodiment of the present invention.

FIG. 11 shows three PICs 1101-1103 optically coupled to a bus waveguide 1104 located in a photonic crystal 1105 that represent an embodiment of the present invention. As shown in FIG. 11, the photonic crystal 1105 includes the bus waveguide 1104, three resonant cavities 1106-1108, and three waveguides 1110-1112. The resonant cavities 1106-1108 can be configured with different dimensions and patterned with holes of various arrangements so that each resonant cavity can maintain a resonance with one of many channels simultaneously transmitted in the bus waveguide 1104. As a result, each of the resonant cavities 1106-1108 serves as a drop filter that extracts via evanescent coupling a particular channel of electromagnetic radiation from the numerous channels transmitted in the bus waveguide 1104. For example, the first resonant cavity 1106 is configured to extract the channel $\overline{\lambda}_1$, the second resonant cavity 1107 is configured to extract the channel $\overline{\lambda}_2$, and the third resonant cavity 1108 is configured to extract the channel $\overline{\lambda}_3$. The channels $\overline{\lambda}_1$, $\overline{\lambda}_2$, and $\overline{\lambda}_3$ can then be transmitted via evanescent coupling to the corresponding waveguides 1110-1112. The waveguides 1110-1112 are each coupled to the PICs 1101-1103 via fiber-to-waveguide couplers 1114-1116, respectively (see e.g., "Ultra-low loss photonic integrated circuit with membrane-type waveguides," by S. J. McNab et al., *Optics Express* 2927, Vol. 11, No. 22, Nov. 3, 2003). The information encoded in the channels $\overline{\lambda}_1$, $\overline{\lambda}_2$, and $\overline{\lambda}_3$ can then be processed by the PICs 1101-1103, respectively.

Figure 12:
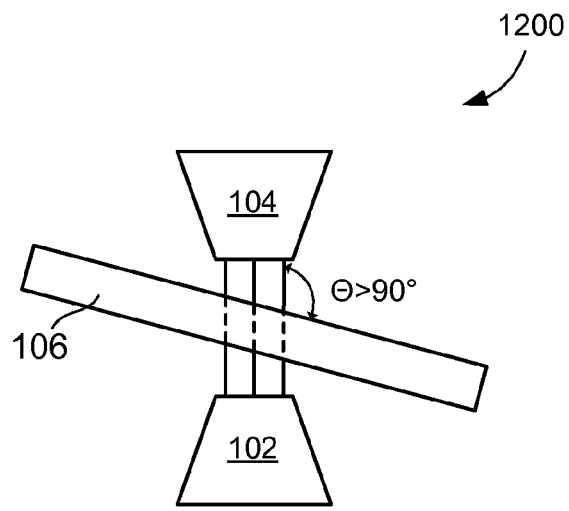
FIG. 12 illustrates a demodulator with nanowires embedded in a waveguide at angle θ greater than 90° that represents an embodiment of the present invention.
Figure 13A:
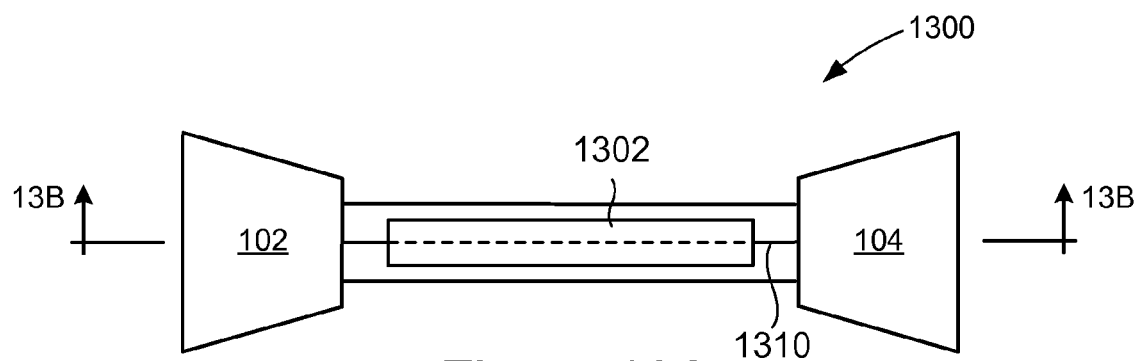
FIGS. 13A-13B illustrates a demodulator with a waveguide substantially parallel to nanowires interconnecting a first terminal to a second terminal that represents an embodiment of the present invention.
Figure 13B:
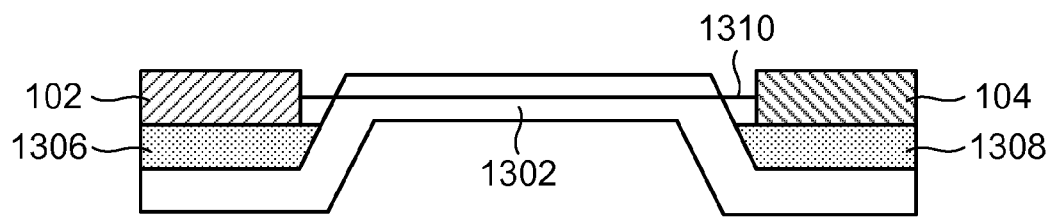

Although the present invention has been described in terms of particular embodiments, it is not intended that the invention be limited to these embodiments. Modifications within the spirit of the invention will be apparent to those skilled in the art. For example, the nanowires shown in FIGS. 1-3 appear at substantially perpendicular to the waveguide 106. However, in other embodiments of the present invention, the nanowires can be at any angle with respect to the waveguide 106. FIG. 12 illustrates a modulator 1200 with nanowires embedded in the waveguide 106 at an angle θ greater than 90° that represents an embodiment of the present invention. In other embodiments of the present invention, the nanowires can also be operatively coupled to the waveguide by located the nanowires either above and/or below the waveguide and not actually embedded within the waveguide. In still other embodiments of the present invention, a number of the nanowires can be embedded in the waveguide and a number of other nanowires can be located in proximity to the waveguide. For example, FIG. 13A illustrates a modulator 1300 that represents another embodiment of the present invention. In FIG. 13A, a nanowire 1310 is embedded in the waveguide 1302, and the remaining two nanowires are located proximal to the waveguide 1302. FIG. 13B illustrates a cross-sectional view of the modulator 1300, shown in FIG. 13A, that represents an embodiment of the present invention. As shown in FIG. 13B, portions of the waveguide 1302 are separated from the first and second terminals 102 and 104 by substrates 1306 and 1308, respectively. The substrates 1304 and 1306 can be $SiO_2$, SiN, or any other suitable substrate that can also serve as a cladding layer for the waveguide 1302. In other embodiments of the present invention, the central nanowire 1310 may be excluded or located above the waveguide 1302.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents:

What is claimed is:

1. A photodetector comprising:
    a waveguide configured to transmit one or more channels of electromagnetic radiation;
    a first terminal and a second terminal, the first terminal and the second terminal positioned on opposite sides of the waveguide; and
    a number of nanowires, each nanowire interconnects the first terminal to the second terminal and a portion of each nanowire is embedded in the waveguide.

2. The photodetector of claim 1 wherein the waveguide further comprises a polymer.

3. The photodetector of claim 1 wherein the first terminal and the second terminal further comprise a combination of one of:
    silicon;
    germanium;
    a III-V semiconductor;
    a II-VI semiconductor;
    a metal; and
    a silicide.

4. The photodetector of claim 3 wherein when either III-V or II-VI semiconductors are used, the first terminal is positively doped and the second terminal is negatively doped.

5. The photodetector of claim 1 wherein the first terminal and the second terminal are connected to a node.

6. The photodetector of claim 5 wherein the node further comprises one of:
    memory;
    a sensor;
    a processor;
    a field programmable gate array; and
    an application specific integrated circuit.

7. The photodetector of claim 1 wherein the nanowires further comprise one of:
    intrinsic silicon;
    intrinsic germanium;
    an intrinsic III-V semiconductor; and
    an intrinsic II-VI semiconductor.

8. An integrated circuit including a photodetector configured in accordance with claim 1.

9. A method for decoding information encoded in a channel of electromagnetic radiation, the method comprising:
    transmitting the channel in a waveguide;
    generating a photocurrent encoding the information as the channel interacts with a number of nanowires embedded in the waveguide; and
    transmitting the photocurrent to a node for further processing.

10. The method of claim 9 wherein generating the photocurrent encoding the information further comprises an electric current induced by the channel.

11. The method of claim 9 wherein transmitting the photocurrent to the node further comprises transmitting the photocurrent over the nanowires from a first terminal to a second terminal and from the second terminal to the node.

12. The method of claim 11 wherein the first terminal and the second terminal further comprise a combination of one of:
    silicon;
    germanium;
    a III-V semiconductor;
    a II-VI semiconductor;
    a metal; and
    a silicide.

13. The method of claim 9 wherein the nanowires further comprise one of:
- intrinsic silicon;
- intrinsic germanium;
- an intrinsic III-V semiconductor; and
- an intrinsic II-VI semiconductor.

14. The method of claim 9 wherein the node further comprises one of:
- memory;
- a sensor;
- a processor;
- a field programmable gate array; and
- an application specific integrated circuit.

15. A photonic integrated circuit comprising:
- a node configured to process information encoded in electrical signals;
- a bus waveguide configured to transmit one or more channels of electromagnetic radiation; and
- a photodetector operably coupled to the node and the bus waveguide, the photodetector including:
  - a waveguide configured to transmit one or more channels,
  - a first terminal and a second terminal, the first terminal and the second terminal positioned on opposite sides of the waveguide, and
  - a number of nanowires each nanowire interconnects the first terminal to the second terminal and a portion of each nanowire is embedded in the waveguide,
  wherein information encoded in one channel transmitted in the waveguide is converted into an electrical signal encoding the information and transmitted to the node for further processing.

16. The photonic integrated circuit of claim 15 wherein the node further comprises one of:
- memory;
- a processor;
- a field programmable gate array; and
- an application specific integrated circuit.

17. The photonic integrated circuit of claim 15 wherein the waveguide further comprises a polymer.

18. The photonic integrated circuit of claim 15 wherein the electrical signal is a photocurrent.

19. The photonic integrated circuit of claim 15 wherein the photodetector operably coupled to a bus waveguide further comprise one of:
- a microring configured to extract a channel of a particular wavelength from the bus waveguide via evanescent coupling; and
- a photonic crystal configured to extract a channel of a particular wavelength from the bus waveguide via evanescent coupling.

* * * * *

UNITED STATES PATENT AND TRADEMARK OFFICE
CERTIFICATE OF CORRECTION

PATENT NO.        : 7,720,326 B2                                              Page 1 of 1
APPLICATION NO.   : 11/699291
DATED             : May 18, 2010
INVENTOR(S)       : Wei Wu et al.

It is certified that error appears in the above-identified patent and that said Letters Patent is hereby corrected as shown below:

In column 10, line 1, in Claim 15, after "nanowires" insert -- , --.

Signed and Sealed this

Twenty-sixth Day of October, 2010

David J. Kappos
*Director of the United States Patent and Trademark Office*